US007467742B1

(12) United States Patent
Gelorme et al.

(10) Patent No.: US 7,467,742 B1
(45) Date of Patent: Dec. 23, 2008

(54) ELECTRICALLY CONDUCTING ADHESIVES FOR VIA FILL APPLICATIONS

(75) Inventors: Jeffrey Donald Gelorme, Plainville, CT (US); Sung Kwon Kang, Chappaqua, NY (US); Konstantinos Papathomas, Endicott, NY (US); Sampath Purushothaman, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/512,400

(22) Filed: Feb. 24, 2000

(51) Int. Cl.
*B23K 31/02* (2006.01)
(52) U.S. Cl. .............................. 228/180.21; 228/248.1
(58) Field of Classification Search ............. 438/613 X; 257/737, 738; 228/123.1, 179.1, 56.3
See application file for complete search history.

(56) References Cited

U.S. PATENT DOCUMENTS

| | | | |
|---|---|---|---|
| 5,089,440 A | * | 2/1992 | Christie et al. |
| 5,652,042 A | | 7/1997 | Kawakita et al. ............. 428/209 |
| 5,865,934 A | * | 2/1999 | Yamamoto et al. |
| 5,985,456 A | * | 11/1999 | Zhou et al. |

OTHER PUBLICATIONS

R Lasky, "New PCB Technologies Emerge for High-Density Interconnect" Electronic Packaging and Production, Apr. 1998, pp. 75-78.

Kang et al, "Development of High Conductivity Lead (Pb)-Free Conducting Adhesives" IEEE Transactions on Conponents, Manufacturing Technology, Part A, vol. 21, No. 1, Mar. 1998, pp. 18-22.

Kang et al, "Development of Low Cost, Low Temperature Conductive Adhesives", Proceedings of the 48th Electronic Components & Technology Conference, Seattle, Wash., May 1998, pp. 1031-1035.

Gonzalez et al, "Epoxy-Based Aqueous-Processable Photodilectric Dryfilm and Conductive Via Plus for PCB Buildup and IC Packaging," Proc 48th Electronic Components Tech. Conf, Seattle. Wash, None 1998. p. 139-143.

\* cited by examiner

*Primary Examiner*—Kiley Stoner
(74) *Attorney, Agent, or Firm*—Thomas A. Beck; Daniel P. Morris

(57) ABSTRACT

Electrically conducting adhesives having a broader selectable range of properties are provided by having random sizes of micrometer diameter range particles coated with a low melting temperature metal. The coated particles are suspended in a vehicle of a mixture of thermosetting resins together with a flux resin selected for viscosity and low shrinkage, for screen printability, for electrical and for mechanical properties over a broad range of specification conditions. The vehicle or resin system includes thermosetting cyclo-aliphatic epoxy, thermosetting phenoxy polymer and thermosetting mono-functional limonene oxide. The low temperature melting coating system for the particles includes In, Sn, and alloys such as In—Sn, Sn—Pb, Bi—Sn—In and InAg. The micrometer diameter range particles includes Cu, Ni, Co, Ag, Pd, Pt, polymer and ceramic.

3 Claims, 1 Drawing Sheet

| Paste ID | Filler (wt%) | Resin (%) | Reflow condition | Electrical (mean/st'd) | Mechanical (mean/st'd) | Remark |
|---|---|---|---|---|---|---|
| AgCu01 | Ag & Cu (>93) | epoxy | 150C, 25psi 30 min | 0.00040 (0.00002) IN OHMS | 4.3(0.9) IN Lbs | commercial paste |
| BiSn48 | BiSn/Cu (68) | epxy(86) phxy(10) flux(4) | 188C, 50 psi 30 min | 0.00041 (0.00006) | 6.7(0.5) | medium flow resin |
| BiSn49 | BiSn/Cu (76) | epxy(43) lim-ox(43) phxy(10) flux(4) | 188C, 25psi 30 min | 0.00027 (0.00004) | 5.4(0.9) | high flow resin |
| BiSn53 | BiSn/Cu (77) | epxy(43) lim-oc(43) phny(10) flux(4) | 188C, 25psi 30 min | 0.00023 (0.00003) | 5.1(0.3) | high flow resin |
| BiSn54 | BiSn/Cu (81) | lim-ox(88) epxy(4) phxy(4) flux(4) | 188C, 25psi 30 min | 0.00018 (0.00002) | 3.4(0.3) | very high flow resin |

Fig. 1.

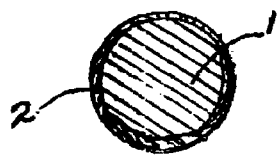

Fig. 2

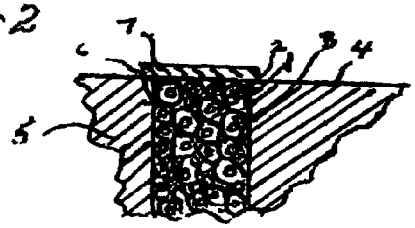

Fig. 3

| Paste ID | Filler (wt%) | Resin (%) | Reflow condition | Electrical (mean/st'd) IN OHMS | Mechanical (mean/st'd) IN Lbs | Remark |
|---|---|---|---|---|---|---|
| AgCu01 | Ag & Cu (>93) | epoxy | 150C, 25psi 30 min | 0.00040 (0.00002) | 4.3(0.9) | commercial paste |
| BiSn48 | BiSn/Cu (68) | epoxy(86) phxy(10) flux(4) | 188C, 50 psi 30 min | 0.00041 (0.00006) | 6.7(0.5) | medium flow resin |
| BiSn49 | BiSn/Cu (76) | epxy(43) lim-ox(43) phxy(10) flux(4) | 188C, 25psi 30 min | 0.00027 (0.00004) | 5.4(0.9) | high flow resin |
| BiSn53 | BiSn/Cu (77) | epxy(43) lim-oc(43) phxy(10) flux(4) | 188C, 25psi 30 min | 0.00023 (0.00003) | 5.1(0.3) | high flow resin |
| BiSn54 | BiSn/Cu (81) | lim-ox(88) epoxy(4) phxy(4) flux(4) | 188C, 25psi 30 min | 0.00018 (0.00002) | 3.4(0.3) | very high flow resin |

ELECTRICALLY CONDUCTING ADHESIVES FOR VIA FILL APPLICATIONS

FIELD OF THE INVENTION

The invention is in the field of electronic apparatus manufacturing of circuitry mounted on an insulating supporting backing, such as a printed circuit board, and in particular to the provision of a wider specification range conductive composition that can fill a hole through the insulating backing and can serve as an interconnection between circuitry on each side of the backing material.

BACKGROUND

Needs are developing in the control of cost and the downsizing of electronic packaging. The goals are to provide higher density, finer pitch and higher performance, all at lower cost. In the mounting of circuitry on an insulating backing, the standard in the art for interconnections or vias through the insulating backing has been the plated through hole. At this state of the art however, the plated through hole technology is encountering cost pressures and it has limits in how dense or tightly packed the circuitry can be.

The operations involved in manufacturing plated through holes or vias are expensive and are not readily adaptable to the future pad density requirements. The present plated through hole technology is approaching limits at about 20 pads or circuit node points per square centimeter. The needs of the technology indicate that a density of many times that will probably be required.

Efforts in the art to meet the density, pitch, performance and cost goals have been directed to a technique called "built up multilayer" where the circuits involve a series of superimposed laminates of foil and insulator that are interconnected using fine pitch holes that are filled with conductive paste. The technique has been extensively discussed in the literature, an example being R. Lasky, Electronic Packaging and Production, April, 1998, pages 75-78. There are many variations. In general the technique can provide a density of greater than 100 pads per square centimeter.

The built up multilayer circuitry technique requires an electrically conducting paste that will be used to fill the many small holes or vias. The paste is also referred to in the art by the term adhesive. The electrically conductive paste must be thermally and reliably compatible with the fabrication and service specifications for the places where it is to be used. The paste, in general, has metal particles suspended in a vehicle, also known in the art by the terminology resin, that can be forced into a via hole through the insulator and when subjected to a curing type cycle, during which the vehicle solidifies with the metal particles in contact with each other forming an electrical path through the via between conductors on surfaces on each side of the insulator.

One such paste is described in U.S. Pat. No. 5,652,042 where metal particles such as copper are suspended in an epoxy vehicle. The paste is squeegeed or doctor bladed into the via holes. There is a heat and pressure cycle that hardens the vehicle. The metal particles in contact with each other provide electrical interconnection.

Further work in paste technology involves introducing silver flakes into the vehicle, coating the metal particles with a low melting metal to produce metallurgical bonding of the metal particles, and, the use of a screen printable paste of silver, copper and epoxy. Problems remain with such process properties as vehicle shrinkage in connection with change of state, and the corrosion and electromigration properties of the metals, especially pure silver and copper.

In patent applications, Ser. No. 09/111,155 filed Jul. 7, 1998 and Ser. No. 09/078,043 filed May 13, 1998 a technology is described of providing and using an alloy coated metal particle which broadens the metallurgical bond forming range thereby providing metallurgical bonds not only between the particles but also to the conducting pads.

As the art progresses, the specifications will become tighter and the process windows will become narrower, so that there will be a growing need for an ever broader range of properties and selection of metal particles and vehicle formulations.

SUMMARY OF THE INVENTION

Electrically conducting adhesives having a broader selectable range of properties are provided by having random sizes of micrometer diameter range particles of for example Cu, Ni, Co, Ag, Pd, Pt, polymer and ceramic each coated with a low melting temperature metal. The coated particles are suspended in a vehicle of a mixture of thermosetting resins together with a flux resin, selected for viscosity and low shrinkage, for screen printability, for electrical and for mechanical properties over a broad range of specification conditions. The vehicle or resin system includes thermosetting cyclo-aliphatic epoxy, thermosetting phenoxy polymer, thermosetting mono-functional limonene oxide and flux. The low temperature melting coating system for the particles includes In, Sn, and alloys such as In—Sn, Sn—Pb, Bi—Sn, Bi—Sn—In and InAg.

BRIEF DESCRIPTION OF THE DRAWINGS

FIG. 1 is a cross sectional depiction of a single random size micrometer diameter range coated particle.

FIG. 2 is a cross sectional depiction of the metallurgical bonds at the tangential contacting area between coated particle intersections and particle and conductor intersections.

FIG. 3 is a compilation of the properties and performance of example formulations of the invention in comparison with a commercially available prior art type of formulation.

DESCRIPTION OF THE INVENTION

An improved electrically conducting adhesive is provided that can be pressed into a via hole in an insulating layer of a to be circuit member and upon curing will have a metallurgical conductive path between surfaces of the insulating layer and a metallurgical bond to conductive members on those surfaces. The adhesive is in paste form as pressed into the hole into the insulating layer. It is solidified in a curing cycle involving heat and pressure.

The electrically conducting adhesive of the invention uses random sizes of micrometer diameter range particles of for example Cu, Ni, Co, Ag, Pd, Pt, polymer and ceramic each coated with a low melting temperature metal. The heat in the curing cycle is of the order of the melting temperature of the coating metal. In the heat and pressure curing cycle the particles join, where there is tangential surface touching, to form fused or diffused metallurgical bonds. The coated particles are suspended in a physical binder or vehicle that is a mixture of thermosetting resins together with a flux resin, selected so that the binder or vehicle and particle combination will have low and selectable viscosity before curing and low shrinkage through the curing cycle and in service. The binder or vehicle is a resin system that includes thermosetting cyclo-aliphatic epoxy, flux, thermosetting phenoxy polymer and may include thermosetting mono-functional limonene oxide. The low temperature melting coating system for the particles includes In, Sn, In—Sn, Sn—Pb, Bi—Sn, Bi—Sn—In and InAg. The electrically conducting adhesive of the invention has improved electrical and mechanical properties over a broad range of specifications and improved viscosity in the pre cured state for such operations as screen printing.

The invention is illustrated by using BiSn as an example for the low melting temperature coating and Cu as the random micrometer range particles. The BiSn alloy is plated on the Cu particles which are in the 5-7 micrometer diameter range. The plating can be accomplished in a plating bath associated with a ball milling type operation as described in patent applications, Ser. No. 09/111,155 Filed Jul. 7, 1998, and Ser. No. 09/078,043 Filed May 13, 1998. The resulting particles are depicted in FIG. 1. Referring to FIG. 1 there is shown a 5-7 micrometer range Cu particle 1 having a surface coating 2 of the BiSn alloy low melting temperature coating. In accordance with the invention the low temperature melting alloy coating 2 imparts a number of specification accommodating advantages. Considering that a regular solder coating would melt at about 215 degrees C., the BiSn eutectic alloy would provide a lower melting temperature of 140 degrees C. with selectable melting temperature values above by alteration of the two alloy ingredient proportions thus providing ability to meet new process window specifications. The BiSn alloy coating 2 also provides corrosion resistance for the Cu particles.

A quantity of powder of the BiSn coated Cu particles is placed in a vehicle or resin system forming a paste that is pressed into via holes through the insulating circuit backing as depicted in FIG. 2. Referring to FIG. 2 a cross sectional depiction is provided of the hole 3 at the surface 4 of the insulator 5 illustrating that the coating 2 on each particle forms a fused metallurgical bond 6 at each tangential contact with adjacent particles and with the conductor 7 on the surface 4. The metallurgical bond can be by solid state bonding or by liquid—solid bonding under the heat and pressure curing cycle. A satisfactory heat cycle would be 150 degrees C. for 30 minutes. A satisfactory pressure cycle would be to apply 500 pounds per square inch for the duration of the heat cycle.

The vehicle or resin system is solvent free and is formulated by mixing thermosetting resins such as cyclo-aliphatic type epoxy, phenoxy polymer, and mono-functional limonene oxide together with a flux resin. The limonene oxide ingredient permits variation of the viscosity of the paste. Viscosity selectability is highly useful in conditions where the aspect ratio of a hole into which the paste must be pressed is high and where screen printing is involved in the manufacturing process. The flux ingredient improves the metallurgical bond between the particles and with the conductors on the surface of the insulator.

The specification variation and processing variation flexibility of the invention are illustrated in FIG. 3 which is a compilation of properties and performance of four example formulations of the invention identified as BiSn48, BiSn49, BiSn53 and BiSn 54; in comparison with a standard commercially available prior art type formulation identified as AgCu01.

The electrical and mechanical properties of all the invention examples and the prior art example are established using a standard in the art joint testing technique as described in the technical article "Development of High ConductivityLead (Pb)-Free Conducting Adhesives" by Kang et al, in IEEE Transactions on Components, Packaging and Manufacturing Technology, Part A, Volume 21, No. 1 pages 18-22 at page 20 thereof.

Referring to FIG. 3 the following observations are advanced.

The electrical and mechanical properties values of the BiSn49, BiSn53 and BiSn54 examples are superior to the commercially available example AgCu01.

Where the insulator is relatively thick, for example about 0.105 inch thick having a hole diameter of 0.010 inch so that the aspect ratio would be 10 or higher; for the hole to be completely conductively filled, the formulations of examples BiSn49 and BiSn54 would be required. A carrier film with a 0.004 inch thick coating of paste may be used in laminating under heat and pressure. Where the insulator is relatively thin, for example about 0.024 inch thick having a hole diameter of 0.008 inch so that the aspect ratio would be 3, a formulation of paste with medium flow characteristics as provided by the example BiSn48 would be best.

Satisfactory materials as listed in the resin % column of FIG. 3 may be acquired from the following:

Cyclo-Aliphatic Epoxy Resin is supplied by Union Carbide Inc. under the designation (ERL-4221E).

(+) Limonene Oxide (a mixture of cis and trans) is supplied by Aldrich Chemical Co. under the designation of (21,832-4)

The phenoxy resin is Paphen™ phenoxy resin is supplied by Phenoxy Specialties Co., under the designation PKHC™ (CAS)25068-38-6

The No Clean Flux is supplied by Qualitek International Inc., under the designation Qualitek #305 flux.

What has been described is a conductive adhesive technology involving combined particle coating and vehicle formulation that imparts flexibility in meeting manufacturing specifications.

What is claimed is:

1. A method for manufacturing an electronic apparatus comprising the serial combination of the steps of:
   providing of an adhesive paste,
   said adhesive paste having random sizes of 5-7 micrometer diameter range Cu particles each coated BiSn suspended in a vehicle of a mixture of cyclo-aliphatic epoxy, phenoxy polymer, mono-functional limonene oxide and a flux, in a proportion of epoxy 4%, phenoxy polymer 4%, monofunctional limonene oxide 88% and flux 4%;
   introducing said adhesive paste into said at least one via hole in said at least one insulating layer, and,
   subjecting the combination of said adhesive paste in said at least one via hole in said at least one insulating layer to a vehicle curing cycle including heat of the order of said low melting temperature of said metal and pressure.

2. A method for manufacturing an electronic apparatus comprising the serial combination of the steps of:
   providing of an adhesive paste,
   said adhesive paste having random sizes of 5-7 micrometer diameter range Cu particles each coated BiSn suspended in a vehicle of a mixture of cyclo-aliphatic epoxy, phenoxy polymer, mono-functional limonene oxide and a flux, in a proportion of epoxy 43%, phenoxy polymer 10%, monofunctional limonene oxide 43% and flux 4%;
   introducing said adhesive paste into said at least one via hole in said at least one insulating layer, and,
   subjecting the combination of said adhesive paste in said at least one via hole in said at least one insulating layer to a vehicle curing cycle including heat of the order of said low melting temperature of said metal and pressure.

3. A method for manufacturing an electronic apparatus manufacturing comprising the serial combination of the steps of:

provide of an adhesive paste, said adhesive paste having random sizes of 5-7 micrometer diameter range Cu particles each coated BiSn suspended in a vehicle of a mixture of cyclo-aliphatic epoxy, phenoxy polymer, and a flux, in a proportion of epoxy 86%, phenoxy polymer 10% and flux 4%, introducing said adhesive paste into said at least one via hole in said at least one insulating layer, and, subjecting the combination of said adhesive paste in said at least one via hole in said at least one insulating layer to a vehicle curing cycle including heat of the order of said low melting temperature of said metal and pressure.

* * * * *